United States Patent
Velazco

(10) Patent No.: US 10,218,325 B2
(45) Date of Patent: Feb. 26, 2019

(54) SPATIAL POWER COMBINING MECHANISM (SPCM) FOR THE GENERATION AND AMPLIFICATION OF ELECTROMAGNETIC RADIATION

(71) Applicant: California Institute of Technology, Pasadena, CA (US)

(72) Inventor: Jose E. Velazco, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 15/499,498

(22) Filed: Apr. 27, 2017

(65) Prior Publication Data

US 2017/0317654 A1    Nov. 2, 2017

Related U.S. Application Data

(60) Provisional application No. 62/328,431, filed on Apr. 27, 2016.

(51) Int. Cl.
| | |
|---|---|
| H03F 3/60 | (2006.01) |
| H04B 1/02 | (2006.01) |
| H03F 1/02 | (2006.01) |
| H03F 3/189 | (2006.01) |
| H03F 3/20 | (2006.01) |
| H02J 50/20 | (2016.01) |

(52) U.S. Cl.
CPC .............. *H03F 3/602* (2013.01); *H02J 50/20* (2016.02); *H03F 1/02* (2013.01); *H03F 3/189* (2013.01); *H03F 3/20* (2013.01); *H03F 2200/451* (2013.01); *H04B 1/02* (2013.01)

(58) Field of Classification Search
None
See application file for complete search history.

(56) References Cited

U.S. PATENT DOCUMENTS

| | | | | |
|---|---|---|---|---|
| 4,496,913 A * | 1/1985 | Wandinger | ............... | H01P 5/12 331/97 |
| 6,292,143 B1 * | 9/2001 | Romanofsky | ............ | H01Q 1/38 343/700 MS |
| 6,490,066 B1 * | 12/2002 | Korevaar | ............... | H04B 10/40 398/128 |
| 7,373,048 B2 * | 5/2008 | Xia | ........................ | B82Y 20/00 359/341.1 |
| 7,830,228 B2 * | 11/2010 | Brown | .................... | H01P 5/183 333/160 |
| 9,608,692 B2 * | 3/2017 | Bennett | .................... | H04B 3/38 |
| 9,608,740 B2 * | 3/2017 | Henry | .................... | H04B 15/00 |
| 9,654,173 B2 * | 5/2017 | Barzegar | .................. | H04B 3/52 |

(Continued)

OTHER PUBLICATIONS

Velazco, J.E., "The Study of Synchronous Beam-Wave Interactions for the Generation of Coherent High-Power Microwave Radiation," PhD Dissertation, George Mason University, 1994.

(Continued)

*Primary Examiner* — Lana N Le
(74) *Attorney, Agent, or Firm* — Gates & Cooper LLP

(57) ABSTRACT

A Spatial Power Combining Amplifier (SPCA) exhibiting a new concept for the amplification of coherent (e.g., microwave) radiation. A general description of the SPCA a power analysis at various SPCA stages is provided. A successfully tested S-band SPCA example was able to deliver 120 W of power with a gain of 50 dB and 50 percent efficiency.

20 Claims, 14 Drawing Sheets

(56) References Cited

U.S. PATENT DOCUMENTS

| | | | |
|---|---|---|---|
| 9,847,850 B2* | 12/2017 | Henry | H04L 1/0025 |
| 9,904,535 B2* | 2/2018 | Gross | H04B 3/52 |
| 9,973,940 B1* | 5/2018 | Rappaport | H04W 16/18 |
| 2010/0079010 A1* | 4/2010 | Hyde | H02J 17/00 |
| | | | 307/149 |
| 2012/0062335 A1* | 3/2012 | Sherrer | H01P 5/12 |
| | | | 333/127 |

OTHER PUBLICATIONS

J. E. Velazco and P. H. Ceperley, "A Discussion of Rotating Wave Fields forMicrowave Applications," IEEE Transactions on Microwave Theory and Techniques, vol. 41, No. 2, pp. 330-335, Feb. 1993.

P. H. Ceperley and J. E. Velazco, "Tuning a Rotating Wave Resonator," Review of Scientific Instruments, vol. 66, No. 1, pp. 256-260, Jan. 1995.

GSSR system description http://gssr.jpl.nasa.gov/gssr.system.html#Transmitters.

Velazco, J.E., et al., "Spatial Power Combining Amplifier for Ground and Flight Applications", IPN Progress Report 42-207, Nov. 15, 2016, pp. 1-12.

* cited by examiner

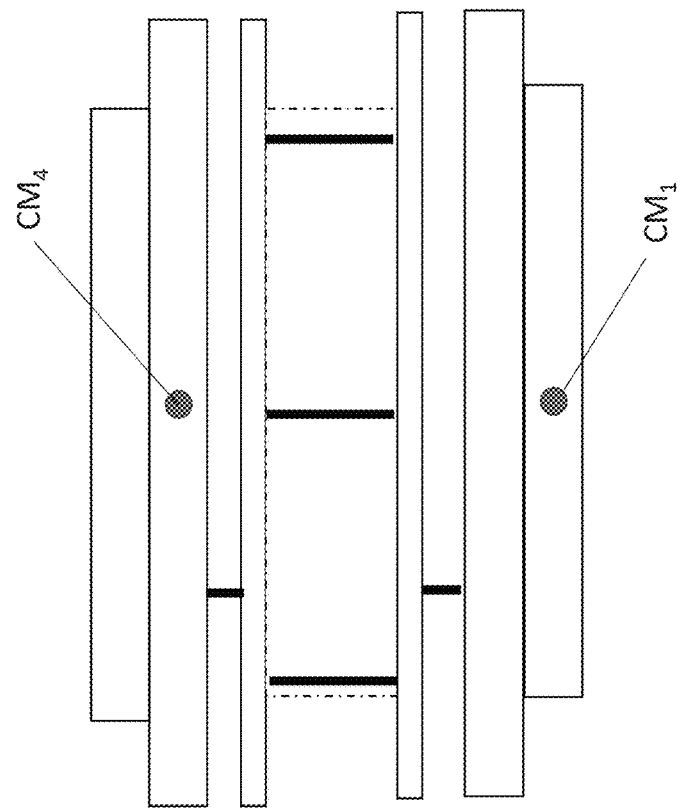
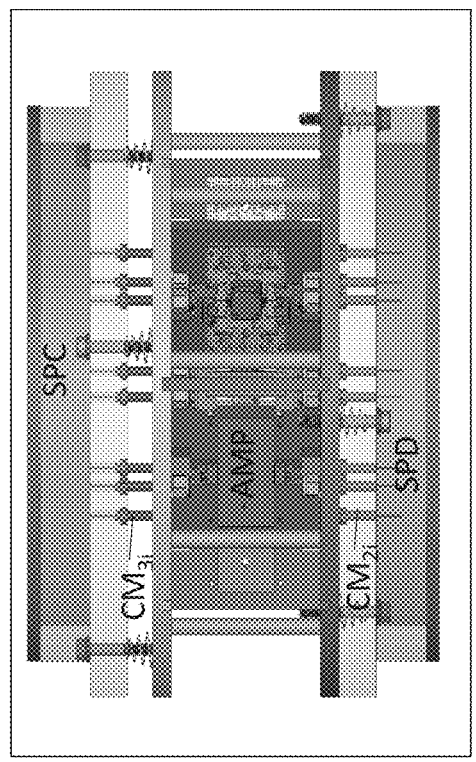
Figure 7A
Figure 7B

Single Fin with MMIC amplifier and heat sink

Thermal image of Fin during operation

SPATIAL POWER COMBINING MECHANISM (SPCM) FOR THE GENERATION AND AMPLIFICATION OF ELECTROMAGNETIC RADIATION

CROSS REFERENCE TO RELATED APPLICATIONS

This application claims the benefit under 35 U.S.C. Section 119(e) of and commonly-assigned U.S. Provisional Patent Application Ser. No. 62/328,431, filed on Apr. 27, 2016, by Jose E. Velazco, entitled "SPATIAL POWER COMBINING MECHANISM (SPCM) FOR THE GENERATION AND AMPLIFICATION OF ELECTROMAGNETIC RADIATION"; which application is incorporated by reference herein.

STATEMENT REGARDING FEDERALLY SPONSORED RESEARCH AND DEVELOPMENT

The invention described herein was made in the performance of work under a NASA contract NNN12AA01C, and is subject to the provisions of Public Law 96-517 (35 USC 202) in which the Contractor has elected to retain title.

BACKGROUND OF THE INVENTION

1. Field of the Invention

The present invention relates to system for amplifying electromagnetic radiation.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Vacuum-tube amplifiers such as klystrons and traveling-wave tubes are the workhorses of high-power microwave radiation generation and are used extensively in ground and flight missions for radar and communications. Vacuum tubes use electron beams as the source of energy to achieve microwave power amplification. Such electron beams operate at high kinetic energies and thus require high voltages to function. In addition, vacuum tubes use compact cavity and waveguide structures that hold very intense radio frequency (RF) fields inside. As the operational frequency is increased, the dimensions of these RF structures become increasingly smaller. As power levels and operational frequencies are increased, the highly intense RF fields inside of the tubes' structures tend to arc and create RF breakdown. In the case of very high-power klystrons, electron interception—also known as body current—can produce thermal runaway of the cavities that could lead to the destruction of the tube. The high voltages needed to power vacuum tubes tend to require complicated and cumbersome power supplies. Consequently, although vacuum tubes provide unmatched high-power microwaves, they tend to arc, suffer from thermal issues, and require failure-prone high-voltage power supplies.

In the civilian and military arenas, high-power tube microwave amplifiers such as klystrons and traveling-wave tubes are commonly used in phase array radar, communications, electron accelerators, and microwave heating of ceramics and materials, among others. These tubes are expensive, typically require high voltages and, as stated earlier, can also become a single point of failure. Another way to generate intense EM radiation has been to array several low-power electromagnetic (EM) sources with the goal of multiplying the power output of a single source. However, this approach requires the use of devices such as microstrip and coaxial power combining structures which suffer from destructive thermal issues (hotspots) due to high power densities posed on the material by the high power EM signal.

In building the transmitter of the future, there is a need for microwave tube amplifier alternatives that are smaller, lighter in weight, more reliable, and have higher power, especially for ground and flight radar and communication applications. The present invention satisfies this need.

SUMMARY OF THE INVENTION

The present disclosure describes a novel Spatial Power Combining Amplifier (SPCA) concept for generating high-power signals (e.g., microwaves). The SPCA comprises a power divider to first divide input power, amplifiers (e.g., Monolithic Microwave Integrated Circuit (MMIC) amplifiers) for amplifying the divided input power, and a spatial power combiner (SPC) including a waveguide/cavity structure for spatially combining the resulting amplified signals.

To better illustrate the SPCA disclosed herein, a non-limiting list of examples is provided below.

In Example 1, the power divider is a spatial power divider (SPD) comprising a waveguide or cavity structure.

In Example 2, the waveguide/cavity structure in the spatial power combiner uses free space (e.g., air) for coherently combining signals, so that power density and thermal issues are greatly reduced.

In Example 3, the waveguide/cavity structure(s) of one or any combination of Examples 1-2 are higher-order-mode microwave structures capable of spatially dividing or combining power and having considerably larger cross-sections than comparable klystrons and traveling-wave tube counterparts, thus further reducing RF breakdown and thermal issues as compared to common to vacuum tubes.

In Example 4, the waveguide or cavity of the SPC in one or any combination of Examples 1-3 is dimensioned such that coupling of the amplified signals to the waveguide/cavity structures generates a combination of the amplified signals comprising an electric, magnetic, or electromagnetic mode having an order higher than a fundamental mode (e.g., higher than a $TE_{10}$ or $TM_{01}$ mode). Examples of higher order modes include, but are not limited to, a $TE_{lmn}$ or $TM_{lmn}$ mode wherein at least one of l, m, or n are integers greater than 0, or a $TE_{mn}$ or $TM_{mn}$ mode wherein both m and n are integers greater than or equal to 1. Such SPCA embodiments have reduced thermal degradation and/or RF breakdown and are capable of high power operation.

In Example 5, the mode in the SPC in one or any combination of Examples 1-4 has sufficiently high order to couple to a number n of amplified outputs from a number n of the amplifiers, wherein n is in a range of 2-1000.

In Example 6, the SPD in one or any combination of Examples 1-5 comprises a waveguide or cavity generating or containing a transverse electric, transverse magnetic, or transverse electromagnetic mode having an order higher than a fundamental mode (e.g., higher than a $TE_{10}$ or $TM_{01}$ mode) when input power is coupled to the SPD waveguide or cavity, so that when the amplifiers are coupled to the SPD via a plurality of couplers, coupling of the mode to the couplers divides the input power into the couplers. Examples of higher order modes include, but are not limited to, a $TE_{lmn}$ or $TM_{lmn}$ mode wherein at least one of l, m, or n are integers greater than 0, or a $TE_{mn}$ or $TM_{mn}$ mode wherein both m and n are integers greater than or equal to 1.

In Example 7, the mode in the SPD of one or any combination of Examples 1-6 has sufficiently high order to receive input power and divide the input power by coupling the mode into a plurality of couplers distributing the input power to a number n of amplifiers, wherein n is in a range of 2-1000.

In Example 8, the mode in one or any combination of Examples 1-7 comprises an asymmetric mode so that the combination of the amplified signals in the SPC has the cylindrical or elliptical polarization of the input power.

In Example 9, the mode in one or any combination of Examples 1-7 comprises a symmetric mode so that the combination of the amplified signals in the SPC comprises linear polarization.

In Example 10, the subject matter of one or any combination of Examples 1-9 further includes the amplifiers coupled to the power divider and the spatial power combiner using coupling mechanisms chosen from a coupling iris, a mode converter, a magnetic loop, an electric capacitive probe, and an antenna.

In Example 11, the SPD or SPC in one or any combination of Examples 1-10 is a resonant cavity.

In Example 12, the SPCA output in one or any combination of Examples 1-10 is connected to at least one load selected from an antenna, a waveguide, a charged-particle accelerator, a cavity, and another SPCA device. For example, an illustrative two-port amplifier as described herein can be used inline as any conventional two-port amplifier and can deliver output power to a coaxial line, a waveguide, a feed, or to any microwave load.

In Example 13, the SPCA of one or any combination of Examples 1-12 is very compact, e.g., contained within a volume of 10 inches by 5 inches by 5 inches.

In Example 14, the SPCA of one or any combination of Examples 1-13 is powered by a simpler, lower-voltage power supply (e.g., 28 V or less).

In Example 15, the SPCA of one or any combination of Examples 1-14 is designed to amplify a variety of microwave signals (e.g., having a wavelength in a range of 0.001-0.3 meters) including, but not limited to, S-band (e.g., 2-4 GHz) and X-band (e.g., 7-11.2 GHz), Ka-band (e.g., 26.5-40 GHz), or W-band (e.g., 75-110 GHz) signals. In one example, an S-band (2.4 GHz) 100-W SPCA has 45-dB gain.

By providing a high-power, reliable microwave source in a very small package, illustrative SPCA embodiments described herein can revolutionize the microwave market for a variety of scientific, military, and industrial applications. For example, the SPCA embodiments described herein have applications in phase array radar, communications, food processing, and microwave materials processing.

BRIEF DESCRIPTION OF THE DRAWINGS

Referring now to the drawings in which like reference numbers represent corresponding parts throughout:

FIGS. 7A and 7B illustrate an SPCA design incorporating 8 MMIC amplifiers, according to one or more embodiments of the present invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1A:
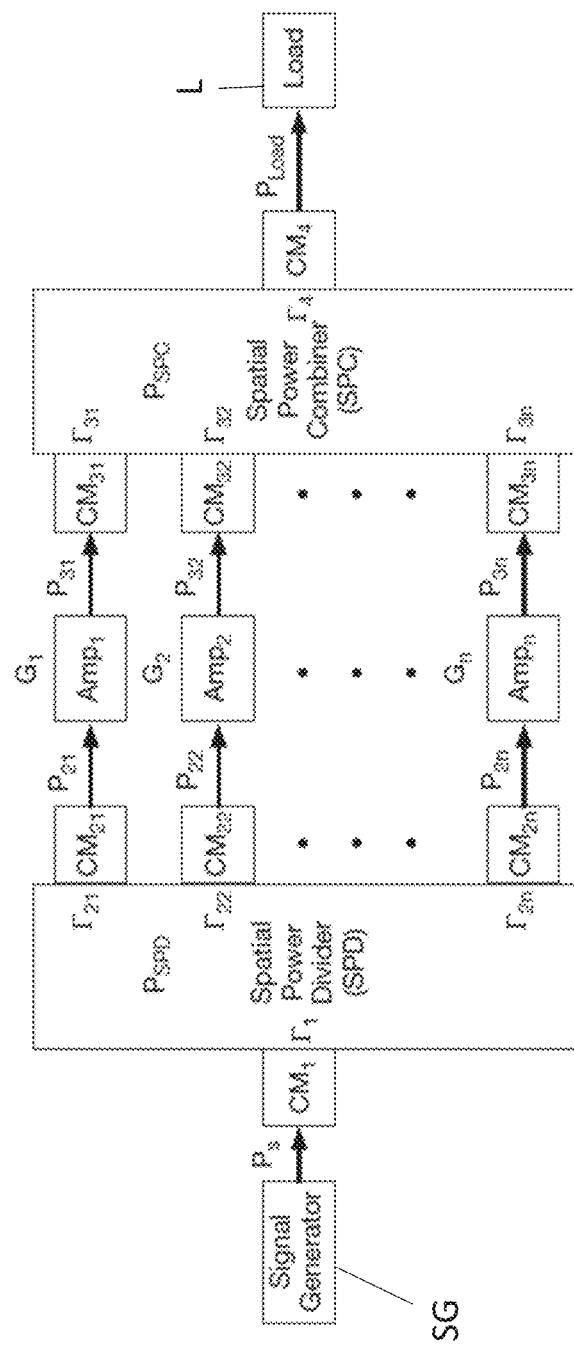
FIG. 1A is a schematic showing various parts of the SPCA amplifier, according to one or more embodiments of the present invention.

FIG. 1A is a general schematic of the SPCA. The SPCA components include a signal generator (SG), a spatial power divider (SPD) structure, coupling mechanisms (CMs), amplifiers (Amps), a spatial power combining (SPC) structure, and a load. Power fed into the SPD is evenly split n-ways and extracted via the coupling mechanisms $CM_{2i}$ (l=1, 2 . . . , n) where n is the number of amplifiers and coupling mechanisms (CMs). Power extracted from the SPD is amplified by a series of identical phased-matched solid-state amplifiers ($Amps_i$ I=1, 2 . . . , n). The amplified power is fed into the SPC via additional coupling mechanisms $CM_{3i}$. High-power microwaves are generated inside the SPC by coherently spatially combining the power delivered by the amplifiers (Amps) via coupling mechanisms $CM_{3i}$ (i=1, 2 . . . , n). The $CM_4$ allows for efficient delivery of the high-power microwaves to the load and $CM_1$ delivers input power to the power divider. FIG. 1A also shows the flow of microwave power along the SPCA, wherein $P_S$ is the power delivered by the signal generator, the microwave power inside the SPD and SPC is represented by $P_{SPD}$ and $P_{SPC}$, respectively, and $P_L$ is the power delivered to the load.

Figure 1B:
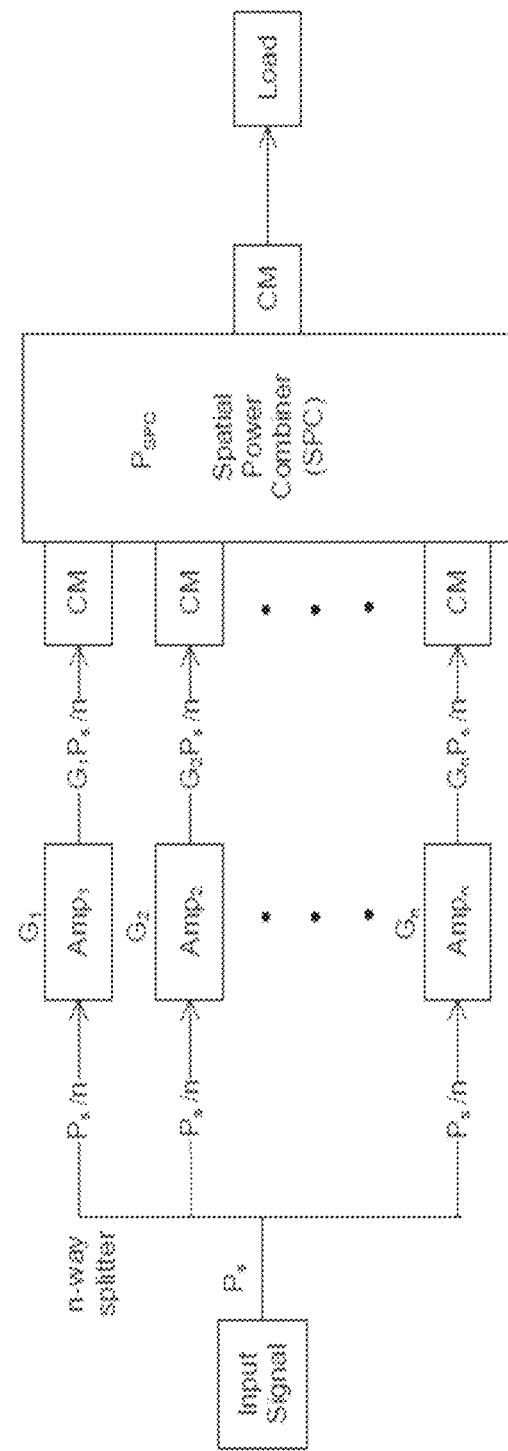
FIG. 1B is a schematic of an SPC connected to an n-way splitter, according to one or more embodiments of the present invention.

FIG. 1B illustrates an SPCA example wherein the SPC is used to spatially power combine signals coming from several electromagnetic (EM) sources, but a spatial power divider (SPD) is not used. Instead, the input signal is split using a conventional n-way splitter before being fed into the high power amplifiers (Amps).

In one or more SPCA embodiments, the SPD and SPC are transmission-line structures that can hold various types of electromagnetic modes including, but not limited to, transverse electromagnetic modes (TEM), transverse-electric (TE) modes, and transverse-magnetic (TM) modes. The transmission-line structures (SPD/SPC) that hold these modes are conducting structures that are hollow (air-filled) or are loaded (filled/lined) with a suitable material of permittivity E and permeability μ. Examples of these transmission line structures include, but are not limited to, rectangular, square, annular, and circular waveguides, or rectangular, square, annular, coaxial, and circular cavity resonators.

The input signal provided by the SG includes, but is not limited to, any type of microwave signal that needs to be boosted and can be provided by a signal generator, oscillator, antenna, preamplifier, another SPCA, or other microwave source.

Examples of the amplifiers (Amps) include, but are not limited to, any type of mechanism that can amplify microwave signals and provide a gain G (the SPCA gain is mainly dictated by the gain value provided by one amplifier). In one or more embodiments, the amplifiers are solid-state MMIC amplifiers.

The coupling mechanisms (CMs) are structures that allow for remotion/injection of microwave signals from/to the SDP and SPC, respectively. Specifically, the CMs allow for feeding microwave power from the SG into the SPD, extraction of the microwave power from the SPD for subsequent amplification by the amplifiers, injection of the amplified power into the SPC, and extraction of the microwave power from the SPC for delivery to the load.

The CMs are properly placed inside the SPC so that the injected signals coherently add up to produce high power inside the SPC. In an ideal case, n CMs each inject $P_{amp}$ amount of power, so that the SPC coherently adds the $P_{amp}$ signals and the total power inside the SPC is $nP_{amp}$.

Examples of CMs include, but are not limited to, coupling irises, mode converters, magnetic loops, electric capacitive probes, wideband antennas, or any other type of antenna. In one example, a CM comprising a waveguide furnished with a coupling iris is used for injection of high power signals (emanating from the high power amplifiers) into the SPC.

Another CM ($CM_4$) is employed to deliver the power inside the SPCs to the load. The load could be another SPCA (e.g., so that several SPCAs are arranged in tandem to increase the overall gain of the resulting device), an antenna, a waveguide, a charged-particle accelerator, a cavity, or any other device requiring high-power microwave radiation.

In various examples, the SPCA is designed to possess one or more of the following features:
Narrowband operation (using cavity resonator structures).
Wideband operation (using waveguide structures or coupled cavities).
Linear/circular polarization (using symmetric/asymmetric TE/TM modes).

In the next section, a general discussion of microwave power transmission along the SPCA is provided.

SPCA Microwave Power Analysis

The value of microwave power along the various SPCA stages is given by (see FIG. 1):

$$P_{SPD} = \Gamma_1 P_S \quad (1)$$

$$P_{21} = \Gamma_1 \frac{P_S}{n} \Gamma_{21} \quad P_{31} = \Gamma_{31} P_{21} G_1$$

$$P_{22} = \Gamma_1 \frac{P_S}{n} \Gamma_{22} \quad P_{32} = \Gamma_{32} P_{21} G_2$$

$$\vdots \quad\quad\quad \vdots$$

$$P_{2n} = \Gamma_1 \frac{P_S}{n} \Gamma_{2n} \quad P_{3n} = \Gamma_{3n} P_{2n} G_n$$

where $\Gamma$ denotes the coupling coefficient or coupling factor of the CMs. This coefficient is an indicator of the level of impedance matching between adjacent microwave structures and therefore qualifies how efficiently power is transferred between the microwave structures. For the SPCA application, $\Gamma$ values are typically ≈1.

Conservation of power inside the SPD dictates that $$\Gamma_1 P_S = \Gamma_1 \frac{P_S}{n} \sum_{i=1}^{n} \Gamma_{2i} + P_R, \quad (2)$$

where $P_R$ is the microwave power that remains inside the SPD structure. Equation (2) simply states that the power extracted from the SPD structure is equal to the injected power minus the power remaining in the SPD (which is typically very small, i.e., $P_R \approx 0$ if $\Gamma_{2i} \approx 1$ for all values of i).

All the signals that are extracted from the SPD are amplified by the amplifiers (Amps) by a factor of G. The amplified signals are subsequently injected into the SPC via their respective CMs. $CM_{3i}$ has a corresponding coupling factor $\beta_{3i}$, where i=1, 2 . . . , n.

In general, for a number n of amplifiers (Amps) and coupling mechanisms (CMs), the total output power inside the SPC, $P_{SPC}$, is given by $$P_{SPC} = \Gamma_1 G \frac{P_S}{n} \sum_{i=1}^{n} \Gamma_{2i} \Gamma_{3i} \quad (3)$$

and $$P_{Load} = \Gamma_4 P_{SPC}, \quad (4)$$

where $G=G_1=G_2 \ldots =G_n$ has been assumed.

When all the coupling mechanisms are critically coupled, i.e., $\Gamma_1=\Gamma_{ki}=1$ (where k=2, 3 and i=1, 2 . . . , n), then $$P_{SPC}=P_S G. \quad (5)$$

In addition, if the maximum power output of each amplifier, $P^{max}_{Amp}$, is denoted as $$P_{Amp}^{max}=P_{31}^{max}=P_{32}^{max}= \ldots P_{3n}^{max}$$

then Equation (3) can be expressed as $$P_{SPC} = \sum_{i=1}^{n} P_{3i}^{max} = nP_{Amp}^{max} \qquad (6)$$

where $\beta_{3i}=1$ has been assumed (for $i=1, 2 \ldots, n$). Equation (5) states that the total gain of the SPCA is provided by the gain G of the Amps. However, the maximum SPCA output power, given by Equation (6), is equal to n times the maximum power provided by one amplifier (Amp). From Equation (3):

$$P_{Amp}^{max} = G\frac{P_S}{n}$$

where it is assumed that $\Gamma_1 = \Gamma_{2i} = \beta_{3i} = 1$, ($i=1, 2 \ldots, n$).

Typically, n>>1 is required to amplify the input microwave signal $P_S$ and produce a large amount of power (beyond the power produced by a single amplifier). Thus, from Equation (6), several amplifiers (Amps) as well as several $CM_2$s and $CM_3$s are required to considerably boost the microwave input signal. This poses a challenging demand on space along the SPCA structure. Consequently, for the SPCA to deliver sizeable amounts of microwave output power, the SPD and SPC structures must be dimensioned in such a way as to allow/accommodate the implementation of several CMs/Amps. In one or more embodiments, n is in a range of 2 to 100. In other embodiments, n is greater than 100 or greater than 400.

Electromagnetic Mode Selection

In order to achieve high output power, the SPCA mechanism requires suitable microwave operating modes that yield a sufficiently large SPD/SPC cross-section that physically accommodates the desired number of coupling mechanisms (CMs) and amplifiers (Amps). Some of the microwave modes that can be chosen for SPCA high-power operation include transverse electric TE and transverse magnetic TM modes inside cylindrical, rectangular, and square cavities and waveguides.

In cylindrical cavities, $TE°_{ml}$ or $Te°_{ml}$ modes can be used, where m and l denote the azimuthal and radial periodicity of the wave, respectively [1]. In rectangular and square structures, $TE^{\square}_{pq}$ or $TM^{\square}_{pq}$ modes can be used (p and q in this case denote the wave periodicity in the x and y direction). Here, ○ denotes cylindrical structures and □ denotes rectangular/square structures. Lower-order modes with small cross-sections (such as $TE_{10}$ modes) are not considered here. In one or more embodiments of the SPCA described herein, $TE_{ml}/TM_{ml}$ modes with m≥1 and l≥1 are preferred because they require larger cross-section structures than the $TE_{10}$ mode, which allows for the insertion of a larger number of CMs/Amps (i.e., n>>1).

Signal Polarization

Depending on the coupling mechanism $CM_1$ used for feeding the input signal into the SPD, the SPCA should allow the injection of signals that are linearly polarized and/or circularly polarized (elliptical polarization is also possible).

If asymmetric modes ($TE_{ml}/TM_{ml}$ with m≠0 for cylindrical structures and m,l>1 for rectangular structures) are used in cylindrical and square cavity/waveguide structures, then the SPCA should be able to amplify circularly polarized signals. In other words, under these conditions, the SPCA should accept a circularly polarized signal at its input and should output an amplified signal with the same circular polarization.

If a symmetric mode is used (m=0 in a cylindrical waveguide/cavity and m=l>1 in a rectangular cavity/waveguide), only linearly polarized signals can be boosted and consequently the SPCA will output linearly polarized amplified signals.

S-Band SPCA Example—Transverse Magnetic $TM°_{110}$ Mode

A basic narrowband example of the SPCA consists of an input cylindrical cavity (SPD), an output cylindrical cavity (SPC), four sets electric probes (CMs), and four MMIC amplifiers (Amps) (i.e., for this example, n=4). The cavities operate in the transverse magnetic $TM°_{110}$ mode [1], which has an azimuthal and radial periodicity equal to 1, i.e., m=l=1.

Figure 2:
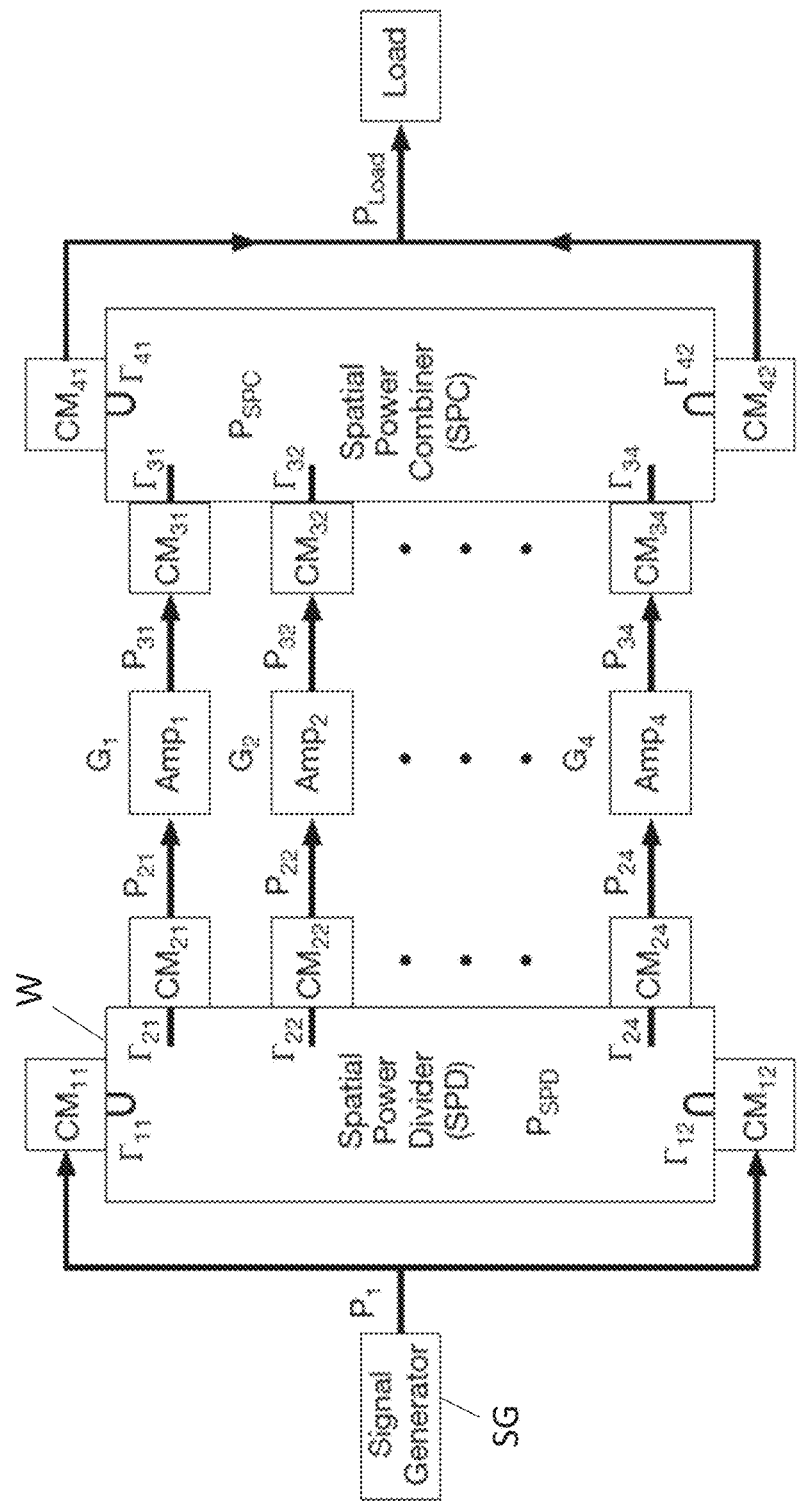
FIG. 2 is a schematic of the S-band SPCA amplifier, according to one or more embodiments of the present invention.
Figure 3:
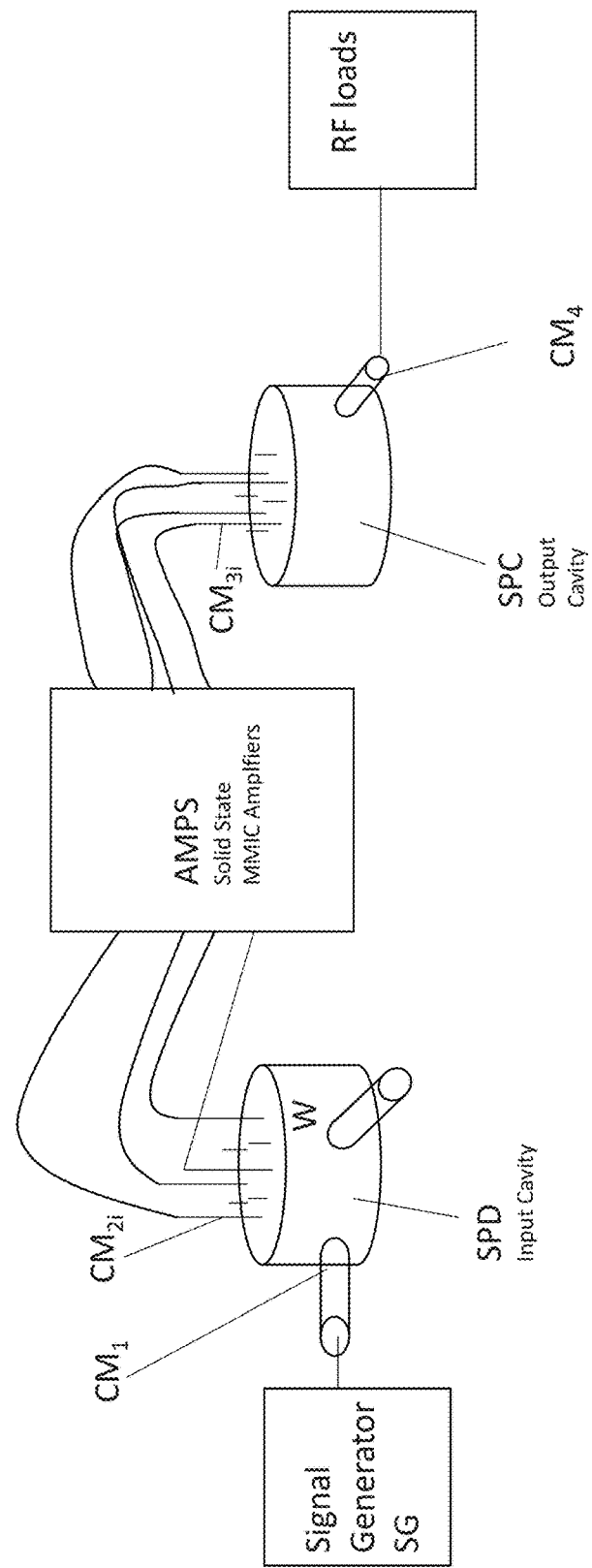
FIG. 3 illustrates an entire S-band SPCA experimental apparatus, according to one or more embodiments of the present invention.

FIG. 2 and FIG. 3 illustrate such an S-band SPCA example where the frequency of operation of the microwave signal is 2.4 GHz. A signal generator (SG) produces the input signal, which is injected into the input cavity via two magnetic loop antenna probes $CM_{2i}$ that are placed orthogonal to each other around the cavity edge wall W. A phase shift of 90 degrees is provided between the two loop antennas via a 90-degree hybrid to produce a rotating (circularly polarized) $TM°_{110}$ mode [2, 4] inside the SPD cavity. Use of only one loop antenna results in the generation of a linearly polarized $TM°_{110}$ mode inside the input cavity.

Four electric probes $CM_{2i}$ are used to extract power from the input cavity SPD for subsequent amplification by the MMIC amplifiers. The amplifiers (Amps) are commercial-off-the-shelf Mini-Circuits devices (model ZHL-30 W-252-S+) that require 28 Volts (V) at 5 Amps (A) to operate. The amplifiers (Amps) have a gain of 47 dB and can produce a maximum output power of 30 Watts (W).

After being amplified by the amplifiers (Amps), the signals are injected into the SPC output cavity via four electric probes $CM_{3i}$, which are critically coupled (with coupling factors near unity), and wherein the $TM°_{110}$ mode coherently combines these signals to produce a high-power version of the mode within the SPC.

High power is extracted from the SPC output cavity via two magnetic loops ($CM_{41}$ and $CM_{42}$) whose output is combined via a 90-degree hybrid prior to being delivered to the load.

Figure 4:
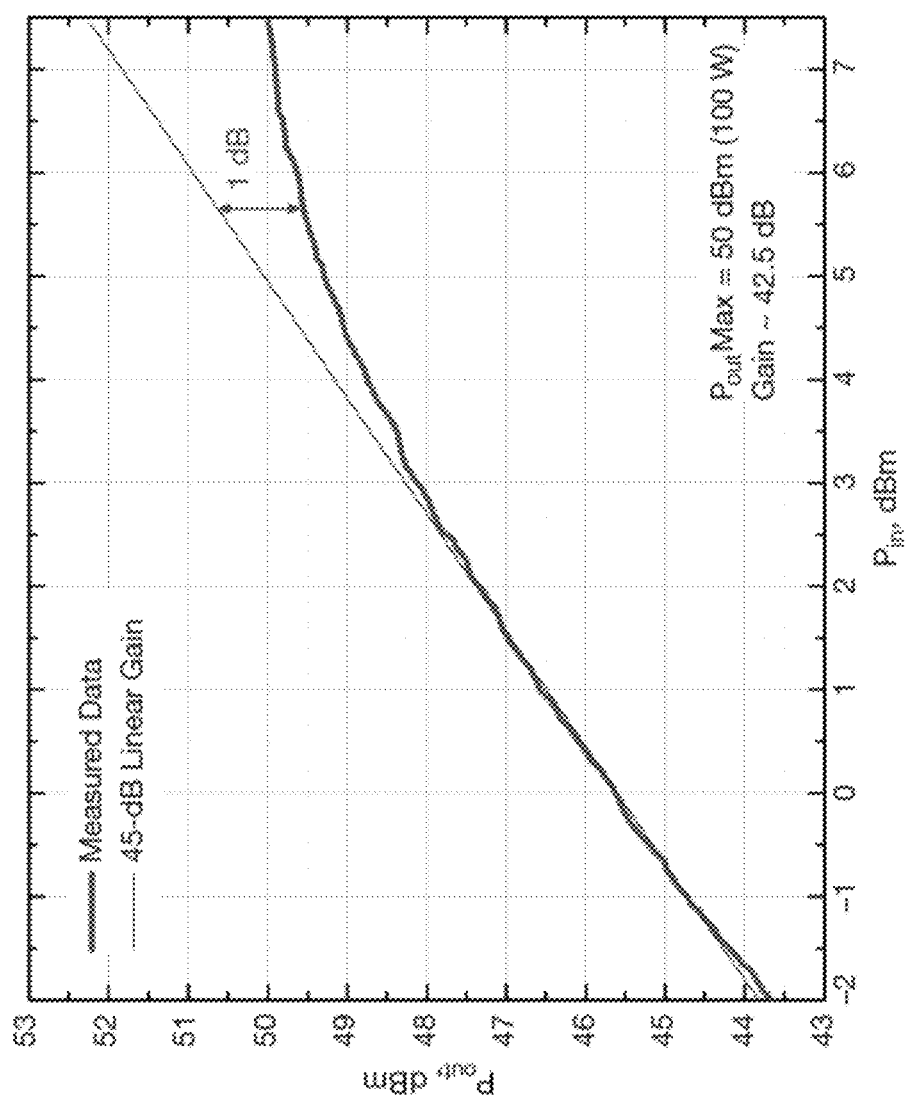
FIG. 4 illustrates measured SPCA output power as a function of input power using the apparatus of FIG. 3. Note that 100 W (50 dBm) is obtained with an input power of 7 dBm. The operating frequency is 2.4 GHz.

FIG. 4 shows a plot of measured output power as a function of input power for a frequency of 2.4 GHz. With an input power of 5 mW (7 dBm), an output power of 100 W is obtained (corresponding to an SPCA gain of 43 dB). The efficiency of the SPCA is dictated mostly by the conversion efficiency of the MMIC amplifier, which in this case is ~40 percent.

These results demonstrate the novel, surprising, and unexpected spatial power combining abilities of the SPCA, specifically that the SPCA mechanism can provide an immediate and viable option for achieving stable and reliable high-power microwave amplification in a compact structure, and is therefore a viable alternative for replacing high power waveguide power combiners commonly employed in the generation of high power radiation. A key advantage of this game-changing concept is that, when compared to conventional tube amplifier counterparts, it offers a factor of at least 4 reduction in size. In addition, as discussed above, thermal issues typical of solid-state power combining methods are avoided using the principle of spatial (air) power combining. The graceful degradation and high reliability of the array of solid-state MMIC amplifiers also provide a significant contribution to the achievement compact and reliable high-power SPCA.

Radial Coupling $TM°_{020}$ Mode Example

Figure 5:
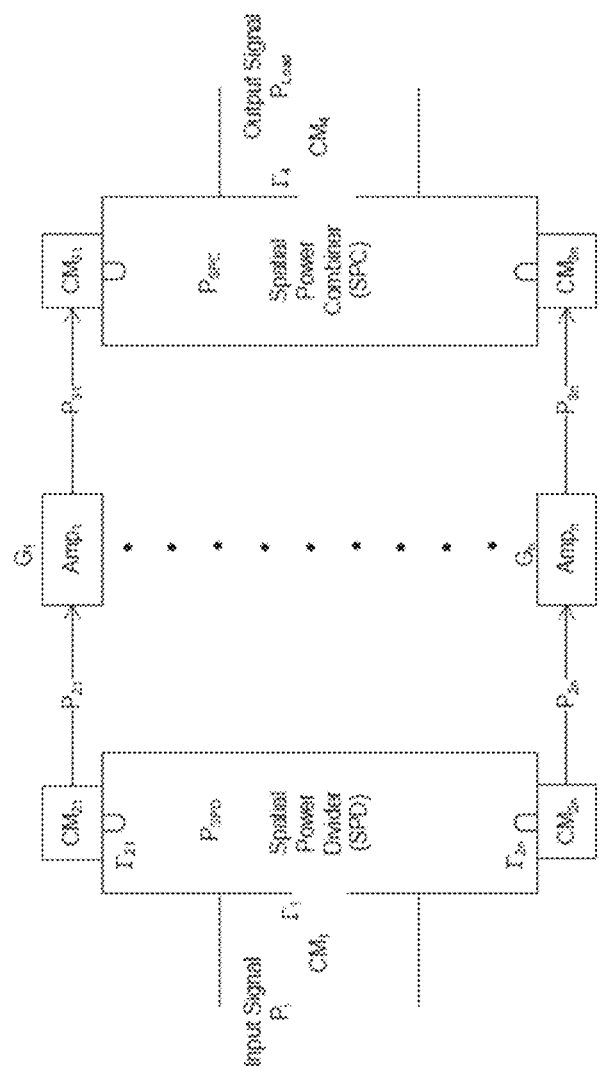
FIG. 5 is a schematic of a symmetric mode SPCA amplifier with a radial coupling mechanism, according to one or more embodiments of the present invention.

Another high power SPCA embodiment includes the radial insertion of a large number of CMs around the SPD/SPC edge walls W. In this case a symmetric mode such as the $TM°_{010}$ mode inside a cylindrical cavity can be used. Coupling mechanisms such as magnetic loops could be employed to remove power from the SPD and to feed power into the SPC. FIG. 5 shows a schematic of such as SPCA embodiment, comprising an input waveguide $CM_1$, a cylindrical SPD input cavity, a set of CMs ($CM_{2i}$ and $CM_{3i}$) and $Amps_i$, and an output SPC cavity.

Variation of the Number of Amplifiers

Figure 6A:
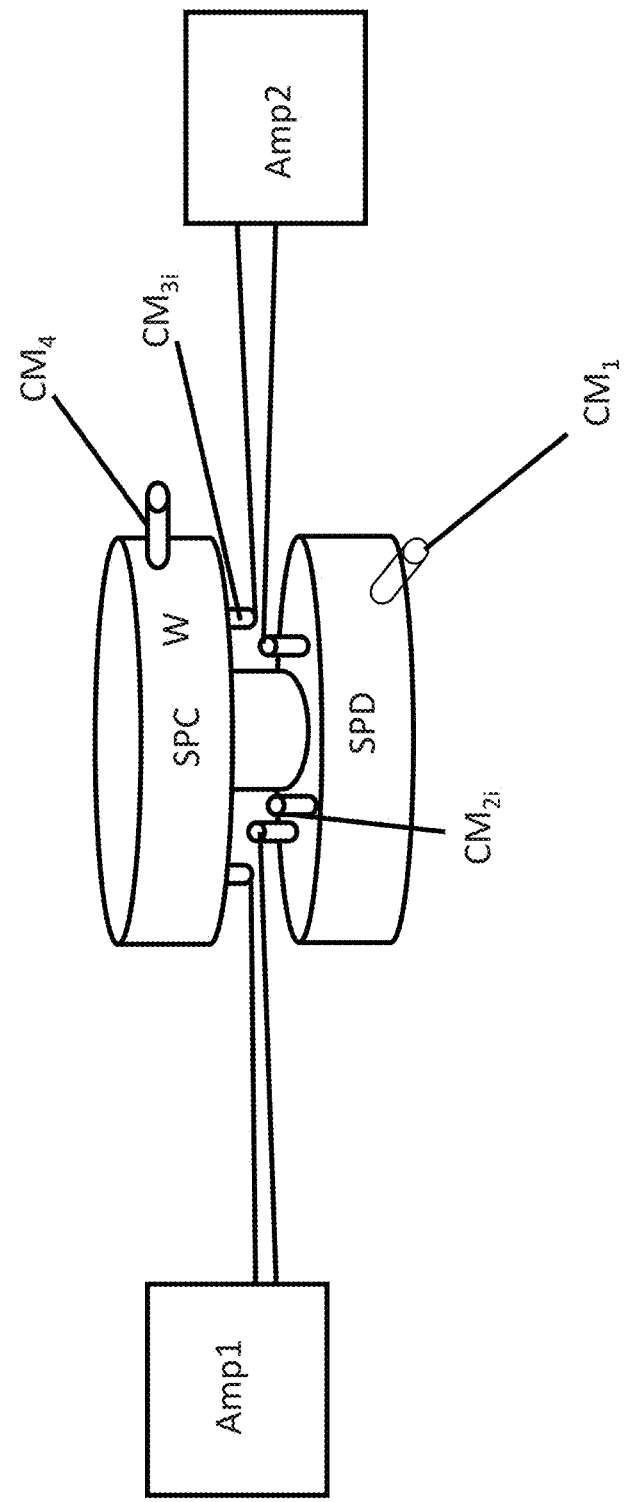
FIG. 6A illustrates an SPCA design incorporating 2 MMIC amplifiers and FIG. 6B illustrates the performance with the 2 MMIC amplifiers, according to one or more embodiments of the present invention.
Figure 6B:
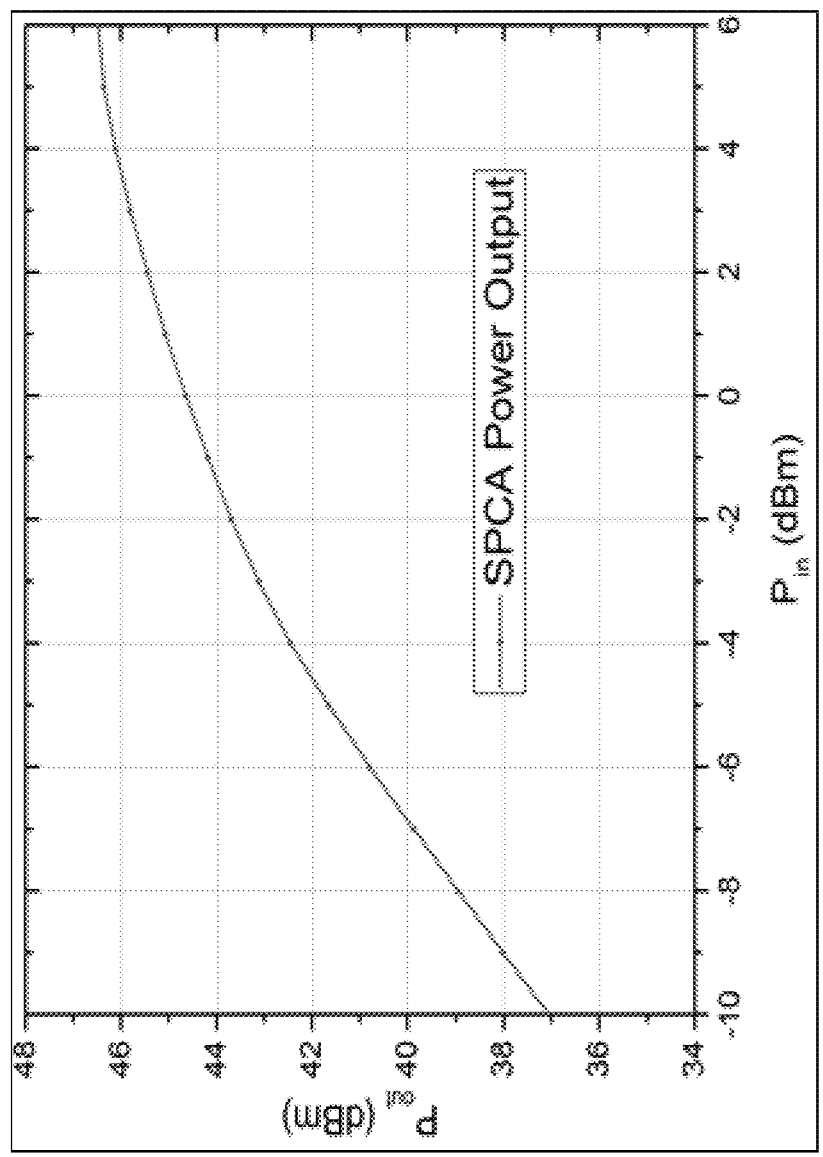

FIG. 6A illustrates an SPCA design incorporating 2 MMIC amplifiers and FIG. 6B illustrates the performance with the 2 MMIC amplifiers, yielding ~50 watts of output power with a gain of 21 dB and 50% efficiency.

FIGS. 7A and 7B illustrate an SPCA design incorporating 8 MMIC amplifiers. After being amplified by the MMICs, the signals are injected into the output cavity SPC via 8 electric probes $CM_{3i}$ which are critically coupled (with coupling factors near unity). In this case, the amplified power emanating from each MMIC amplifier is injected into the SPC output cavity where the $TM°_{110}$ mode coherently combines to produce high power (8×250 W=200 W) of S-band radiation. The high power is extracted from the SPC output cavity via a coupling iris $CM_4$ which delivers the signal to a circular waveguide for subsequent use. In this implementation, the SPCA input power fed into the SPC by the SG is 2 watts and the output power produced by it is 200 watts. This results in a SPCA gain of 20 dB. The efficiency of the SPCA is dictated mostly by the conversion efficiency of the MMIC amplifier, which in this case is ~50%.

In a further embodiment of the S-band SPCA, the number of MMICs is increased to 16, i.e., n=16. With 16 MMICs, the expected output power is 400 W with an associated gain of 50 dB and 50 percent efficiency.

Further high-power S-band examples include 2-kW SPCAs using 80 MMIC amplifiers and a 10-kW SPCA using 400 MMICs. In addition, as mentioned above, several SPCAs could be arranged in tandem to increase the overall gain. For instance, if a two-cavity SPCA using one set of MMICs produces 30 dB of gain, using three cavities (with two sets of MMICs) can yield 60 dB gain.

Frequency of Operation

Figure 8:
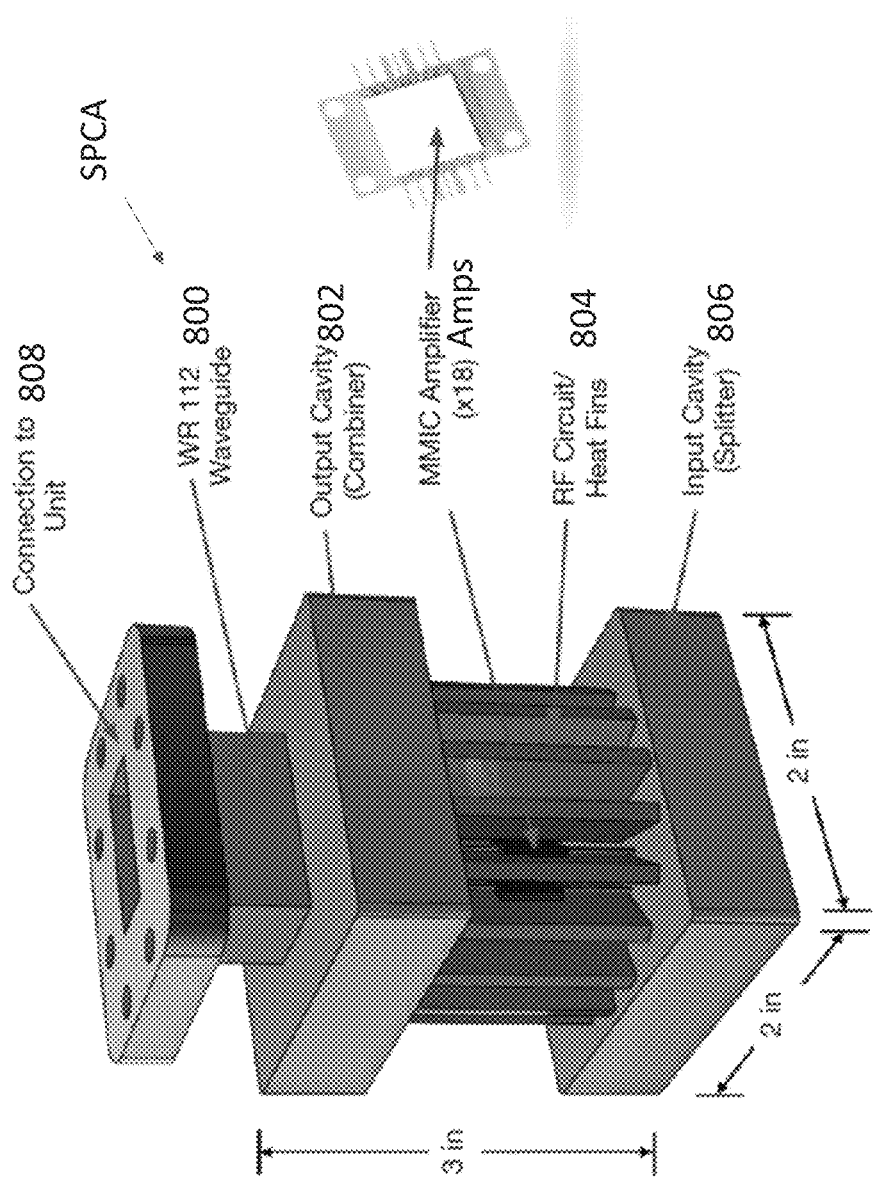
FIG. 8 illustrates an X-band SPCA design capable of producing 1 kW of power by power combining 18 solid-state MMIC amplifiers, according to one or more embodiments of the present invention.

The SPCA can easily be scaled up to work at higher frequencies, including but not limited to, X-, Ka-, and W-band frequencies. FIG. 8 illustrates an X-band SPCA designed to deliver more than 1 kW of microwave power at 8.4 GHz, comprising WR 112 waveguide 800, output cavity (spatial power combiner 802) for coherently spatially combining the outputs from 18 60 W MMIC amplifiers (Amps), an RF circuit and heat fins 804, an input cavity (splitter or power divider 806), and a connection 808 to an external unit. The SPCA has dimensions of 2 inches (in) by 2 in by 3 inches.

Table 1 lists SPCA designs for X-, Ka-, and W-bands.

TABLE 1

| Parameter | X-Band (8.4 GHz) | Ka-Band (32 GHz) | W-Band (94 GHz) |
| --- | --- | --- | --- |
| Cross-Section | 2" × 2" | 0.5" × 0.5" | 0.2" × 0.2" |
| Height | 3" | 1" | 0.4" |
| Number of MMICs | 18 | 8 | 6 |
| SPCA Output Power | 1080 W | 65 W | 5 W |

Advantages and Improvements

The generation of high-power microwave radiation is technically difficult, typically limited by (among other things) the stresses posed by very high-power densities produced by intense microwave fields. Such stress may lead to radio frequency (RF) breakdown and destructive thermal issues. Vacuum-tube amplifiers such as klystrons and traveling-wave tubes have been the workhorses for generating the desired high power output. In NASA's Deep Space Network (DSN), S-band (2025-2120 MHz) and X-band (7145-7190 MHz) uplink communications with spacecraft are achieved via multi-kilowatt klystron amplifiers. These high average power klystrons are used by several Deep Space Stations (DSSs) to provide data uplink for numerous deep-space missions. Klystrons are currently installed in DSS 70-m and 34-m antennas. Over the past years, these vacuum devices have suffered from arcing and RF breakdown issues and have the potential to become single-point-failure items that could preclude communications with spacecraft, and eventually could force the shutdown of the entire DSS. Consequently, there is a clear need to find a suitable and reliable replacement for these amplifiers in order to prevent uplink failure, reduce maintenance costs, and minimize downtime of the stations furnished with these klystrons.

NASA's Goldstone Solar System Radar (GSSR) uses two 250-kW klystrons to generate high-power X-band (8.4 GHz) signals for imaging of asteroid and planetary surfaces in the solar system [3]. Due to the high-power operation required by the USSR, these klystron tubes are pushed to their limits. The high-power densities existing inside the tube envelope generate severe thermal issues that can consequently translate into tube failure and poor reliability. For example, over the past 10 years, there has been an average failure rate of one klystron tube per year.

In addition, flight mission transmitters use microwave tubes, such as traveling-wave tubes and extended interaction klystrons (EIKs), for both radar and communications that also could become single-point-failure items that can jeopardize mission success. Missions that currently use or plan to use EIKs include CloudSat, EarthCare, and Surface Water and Ocean Topography (SWOT).

Moreover, microwave power combining is commonly used in commercial power amplifiers where MMICs are arrayed on microstrip boards to produce high-power radiation. However, such power combining is achieved via power combiners that are embedded on the microstrip boards so that these solid-state power combiners also tend to become single points of failure. Due to the high power densities generated by the high-power signals, thermal hotspots occur on the solid-state power combiner which then tends to fail, rendering the whole amplifier useless.

Figure 9A:
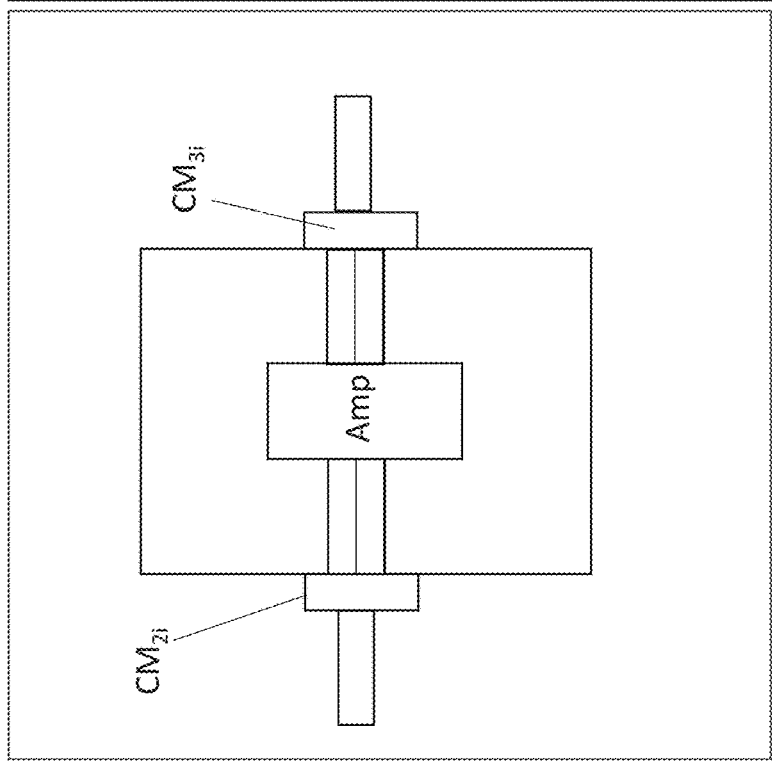
FIG. 9A illustrates a single fin with MMIC amplifier and heat sink and FIG. 9B is a thermal image of the fin during operation, according to one or more embodiments of the present invention FIG. 10 compares an SPCA assembly, according to one or more embodiments of the present invention, with a conventional klystron assembly.
Figure 9B:
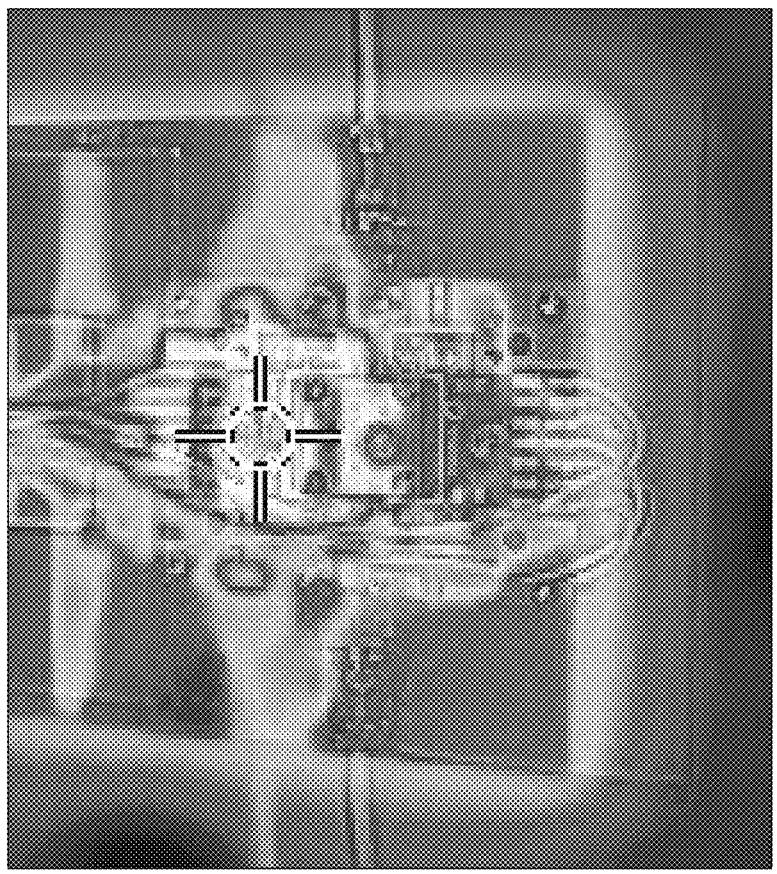

A key advantage of SPCA embodiments described herein, on the other hand, is that the only active elements used in this mechanism are reliable solid-state MMICs. The usage of several MMICs allows the generation of high power and enables a key SPCA feature: graceful degradation. In the event of failure of several MMIC amplifiers, the SPCA continues to provide high-power radiation. FIG. 9B shows a thermal image of the MMIC amplifier with a heat sink, evidencing uniform heat spreading and avoidance of hot spots, thereby reducing thermal degradation of the amplifier as compared to competing power-combining technologies which use devices such as microstrip and coaxial power combining structures and that suffer from destructive thermal issues (such as hotspots, due to high-power densities imposed on the material by the high-power microwave signals).

A further novelty of the SPCA is the use of circularly polarized and/or linearly polarized signals. If a circularly polarized signal is injected at the input of the SPCA device, the SPCA will amplify this signal and the output signal will maintain the same circular polarization.

Figure 10:
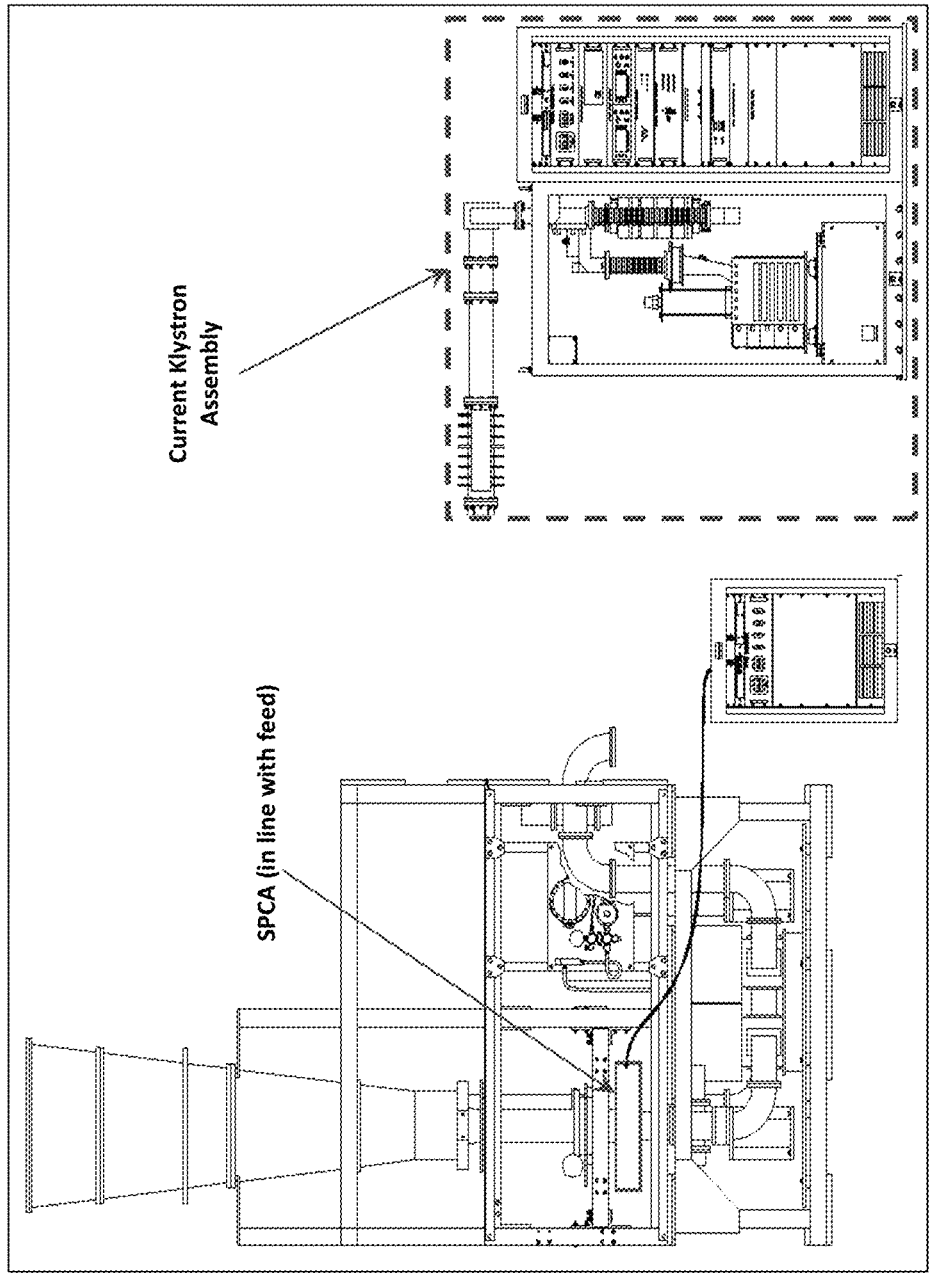

Furthermore, one or more SPCA embodiments described herein offer the advantage of a factor of 4 or 5 reduction in volume and reduced DC power, when compared to conventional tube amplifiers. FIG. 10 illustrates an SPCA assembly packaged in a much smaller volume as compared to a conventional klystron assembly. Moreover, unlike tube counterparts that require high operating voltages (with associated large power supplies), the SPCA can be operated at low voltages (small power supply).

Example Applications

The SPCA devices described herein can be incorporated in (e.g., high bandwidth) radar and communications transmitters (e.g., for space, airborne, satellite or ground applications). Phase array radar at S-, X-, Ka- and W-band frequencies is useful for military applications, civilian applications, and space applications (X-band arrays could replace klystrons in the Goldstone Solar System Radar and amplifiers at S-, X-, Ka-bands are useful for DSN communications). Moreover, the ability to have large output power in a small, compact package, with the added advantage of thermal stability due to spatial (air) power combining, will lead to revolutionary new instruments for future cloud radar in Earth science, and planetary, comet, or asteroid radar sensing.

The SPCAs described herein can be incorporated in particle accelerators for food, material processing and high energy physics.

The SPCAs described herein may be incorporated in microwave transmitters used for microwave processing of materials and ceramics.

The SPCAs described herein may be used in transmitters used for wireless power beaming (e.g., microwave wireless power beaming). Such transmitters may be used to transmit microwave energy from space-based solar stations to ground stations, for satellite-to-satellite power beaming, for beaming power between planetary rovers and miniature rovers, or for beaming power from larger spacecraft to power smaller spacecraft.

The SPCAs described herein may be used in electric propulsion thrusters (e.g., so as to provide unparalleled thrust and specific impulse for future deep space missions).

Process Steps

Figure 11:
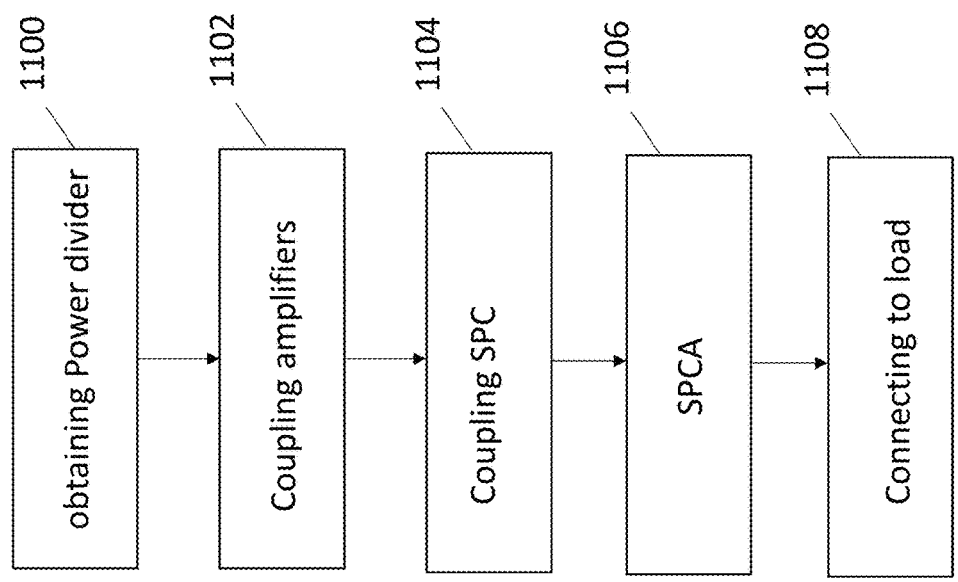
FIG. 11 is a flowchart illustrating a method of fabricating an SPCA assembly, according to one or more embodiments of the present invention.

FIG. 11 illustrates a method of fabricating an SPCA. The method comprises the following steps.

Block 1100 represents obtaining a power divider (e.g., spatial power divider (SPD) or conventional splitter).

Block 1102 represents coupling amplifiers to the power divider. Examples of amplifiers include, but are not limited to, COTS amplifiers (e.g., solid state MMIC amplifiers), vacuum tubes such as klystrons or traveling wave tubes, or laser amplifiers.

Block 1104 represents coupling a spatial power combiner (SPC) to the amplifiers.

The amplifiers are coupled to the power divider using input couplers $CM_{2i}$ and are coupled to the spatial power combiner using output couplers $CM_{3i}$. In one or more examples, the input and output couplers are each independently chosen from a coupling iris, a mode converter, a magnetic loop, an electric capacitive probe, and an antenna.

Block 1106 represents the end result, an apparatus comprising a power divider (e.g., SPD) dividing power, inputted on the power divider, into a plurality of portions; the spatial power combiner (SPC); and amplifiers (Amps) coupled to the power divider and the SPC, wherein each amplifier amplifies one of the portions so as to form an amplified output, and the spatial power combiner (SPC) spatially and coherently combines the amplified outputs into a combined output inside the SPC structure. Successful power combining is achieved inside the SPC when the injected amplified signals/outputs are properly phased with the EM mode residing inside the SPC. In various examples, the EM power produced inside the SPC is then equal to the input power $P_S$ times the gain G of the amplifiers, i.e. $P_{SPC}=GP_S$.

In one or more examples, the spatial power combiner (SPC) comprises a waveguide or cavity dimensioned such that coupling of the amplified outputs to the waveguide or cavity generates the combined output comprising a transverse electric, transverse magnetic, or transverse electromagnetic mode in the waveguide or cavity, the mode having an order higher than a fundamental mode (e.g., higher than a $TE_{10}$ or $TM_{01}$ mode). In one or more embodiments, the amplified outputs couple to and/or generate the mode in the cavity or waveguide comprising a $TE_{lmn}$ or $TM_{lmn}$ mode wherein at least one of l, m, or n are greater than 0, or a $TE_{mn}$ or $TM_{mn}$ mode wherein both m and n are greater than or equal to 1 and represent wave periodicity in the waveguide in two different directions in the waveguide.

In various examples, the mode in the SPC has sufficiently high order to couple to a number n of amplified outputs from a number n of the amplifiers, wherein n is in a range of 2-1000.

In one or more embodiments, the mode comprises an asymmetric mode so that the combined output maintains cylindrical or elliptical polarization of the input power.

In one or more further embodiments, the mode comprises a symmetric mode so that the combined output comprises a linear polarization.

In one or more embodiments, the amplified outputs are combined in free space (e.g., air, vacuum, or other material having a permittivity and permeability) inside the waveguide.

In one or more examples, the spatial power divider (SPD) comprises a waveguide or cavity generating or containing an electric, magnetic, or electromagnetic mode having an order higher than a fundamental mode (e.g., higher than a $TE_{10}$ or $TM_{01}$ mode) when input power is coupled to the SPD waveguide. When the amplifiers are coupled to the SPD via a plurality of couplers, coupling of the mode to the couplers divides the input power into the couplers. Examples of the modes supported by the SPD waveguide or cavity and coupling to the couplers and input power include but are not limited to, a $TE_{lmn}$ or $TM_{lmn}$ mode wherein at least one of l, m, or n are greater than 0, or a $TE_{mn}$ or $TM_{mn}$ mode wherein both m and n are greater than or equal to 1 and represent wave periodicity in the waveguide in two different directions in the waveguide. In various examples, the mode in the SPD has sufficiently high order to couple and divide the input power into a plurality n of couplers CM, wherein n is in a range of 2-1000.

In one or more embodiments, the spatial power combiner and/or the spatial power divider comprise a resonant cavity.

In various examples, the amplifiers are coupled to the power divider and the spatial power combiner via suitable coupling mechanisms (e.g., input and output couplers comprising unity coupling mechanisms) that are designed and tuned so as to provide near unity coupling (e.g., so that the amplifiers are coupled to the power divider and the spatial power combiner with a coupling factor within 1% of unity).

In one or more examples, the input signal comprises a microwave signal (e.g., THz or GHz signal) or such as an S-band (e.g., in a range of 2-4 GHz or at 2.4 GHz), X-band (e.g., in a range of 7-11.2 GHz or at 8.4 GHz), W-band (e.g., in a range of 75-110 GHz or at 94 Ghz), or Ka-band signal (e.g., in a range of 26.5-40 GHz or at 32 GHz).

Block 1108 represents connecting an output of the apparatus to a load for use in an application. In one or more embodiments, the output is connected to at least one load selected from an antenna, a waveguide, a charged-particle accelerator, a cavity, and another SPCA device.

Figure 12:
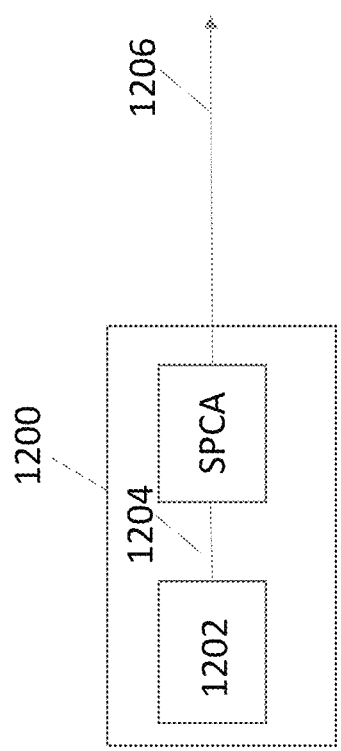
FIG. 12 illustrates a transmitter comprising an electromagnetic (EM) radiation source (e.g. microwave source) coupling EM radiation into the SPCA according to one or more embodiments of the invention.

FIG. 12 illustrates a transmitter 1200 comprising a electromagnetic (EM) radiation source 1202 (e.g. microwave source) coupling EM radiation 1204 into the SPCA according to one or more embodiments of the invention, wherein the transmitter transmits the amplified EM radiation 1206 outputted form the SPCA for use in an application (e.g., for wireless power beaming, for communication in a free space data link, or for a radar application).

In one example, a radar or communications system comprises the microwave transmitter 1200, wherein microwaves transmitted form the transmitter have been amplified by the SPCA.

In another example, a free space data link comprises a first station including the transmitter 1200, wherein the transmitter transmits the microwaves amplified by the SPCA so as to communicate between the first station and second station remote from the first station.

In yet another example, a wireless power beaming system comprises the transmitter 1200, wherein the transmitter transmits power using the microwaves amplified by the SPCA.

REFERENCES

The following references are incorporated by reference herein.
[1] J. E. Velazco and P. H. Ceperley, "A Discussion of Rotating Wave Fields in Microwave Applications," *IEEE Transactions on Microwave Theory and Techniques*, vol. 41, no. 2, pp. 330-335, February 1993.
[2] P. H. Ceperley and J. E. Velazco, "Tuning a Rotating Mode Resonator," *Review of Scientific Instruments*, vol. 66, no. 1, pp. 256-260, January 1995.
[3] GSSR system description http://gssr.jpl.nasa.gov/gssr.system.html#Transmitters
[4] J. E. Velazco, "The Study of Synchronous Beam-Wave Interactions for the Generation of Coherent Microwave Radiation," PhD Dissertation, George Mason University, 1994.
[5] Spatial Power Combining Amplifier for Ground and Flight Applications, by Jose E. Velazco and Mark Taylor. IPN Progress Report 42-207, Nov. 15, 2016.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus, comprising:
   a power divider dividing input power, inputted on the power divider, into a plurality of portions;
   a spatial power combiner; and
   amplifiers coupled to the power divider and the spatial power combiner, wherein:
      each amplifier amplifies one of the portions so as to form an amplified output,
      the spatial power combiner coherently combines the amplified outputs into a combined output, and
      the spatial power comprises a waveguide dimensioned such that coupling of the amplified outputs into the waveguide generates the combined output comprising a transverse electric, mode having an order higher than a $TE_{10}$ mode, or a transverse magnetic mode having an order higher than a $TM_{01}$ mode, or a transverse electromagnetic mode having an order higher than a fundamental mode.

2. The apparatus of claim 1, wherein the spatial power combiner comprises a waveguide dimensioned such that coupling of the amplified outputs into the waveguide generates the combined output comprising:
   a $TE_{lmn}$ or $TM_{lmn}$ mode wherein l, m, or n are integers, or
   a $TE_{mn}$ or $TM_{mn}$ mode wherein both m and n are integers, and l represents an order of the mode and m and n represent wave periodicity in the waveguide in two different directions in the waveguide.

3. The apparatus of claim 1, wherein the mode couples to a number n of amplified outputs from a number n of the amplifiers, wherein n is in a range of 2-1000.

4. The apparatus of claim 1, wherein the mode comprises an asymmetric mode so that the combined output maintains cylindrical or elliptical polarization of the input power.

5. The apparatus of claim 1, wherein the mode comprises a symmetric mode so that the combined output comprises a linear polarization.

6. The apparatus of claim 1, wherein the amplifiers are coupled to the power divider and the spatial power combiner via coupling mechanisms with a coupling factor within 1% of unity.

7. An apparatus, comprising:
   a power divider dividing input power, inputted on the power divider, into a plurality of portions,
   a spatial power combiner;
   amplifiers coupled to the power divider and the spatial power combiner, wherein:
      each amplifier amplifies one of the portions so as to form an amplified output,
      the spatial power combiner coherently combines the amplified outputs into a combined output, and
      the amplified outputs are combined in free space inside the waveguide; and
   input couplers and output couplers, wherein,
      each of the input couplers couples one of the amplifiers to the power divider,
      each of the output couplers couples one of the amplifiers to the spatial power combiner,
      the input couplers and output couplers are designed and tuned so as to provide near unity coupling, and the input couplers and output couplers are each independently selected from at least one member chosen from a coupling iris, a mode converter, a magnetic loop, an electric capacitive probe, and an antenna.

8. The apparatus of claim 1, wherein the power divider comprises a spatial power divider.

9. The apparatus of claim 8, wherein the spatial power combiner and the spatial power divider each comprise a resonant cavity.

10. The apparatus of claim 1, wherein the amplifiers each comprise a solid state MMIC amplifier.

11. The apparatus of claim 1, wherein the combined output is connected to at least one load selected from an antenna, a waveguide, a charged-particle accelerator, a cavity, and a power divider.

12. The apparatus of claim 1, wherein the input power comprises a microwave signal.

13. The apparatus of claim 1, wherein the input power comprises an S-band, X-band, W-band, or Ka-band signal.

14. A microwave transmitter comprising the apparatus of claim 1, wherein microwaves transmitted form the transmitter have been amplified by the apparatus.

15. A radar or communications system comprising the microwave transmitter of claim 14.

16. A communication device comprising a first station including the transmitter of claim 14, wherein the transmitter transmits the microwaves so as to communicate between the first station and second station remote from the first station.

17. A wireless power beaming system comprising the transmitter of claim 14, wherein the transmitter transmits power using the microwaves.

18. A system comprising a plurality of apparatuses of claim 1,
wherein:
the combined output from one of the apparatuses provides the input power to another of the apparatuses.

19. The apparatus of claim 1, wherein the input power comprises a wavelength in a range of 0.001-0.15 meters.

20. A method of fabricating an apparatus, comprising:
coupling amplifiers coupled to a power divider and a spatial power combiner, wherein:
the power divider divides input power, inputted on the power divider, into a plurality of portions,
each amplifier amplifies one of the portions so as to form an amplified output, and
the spatial power combiner coherently combines the amplified outputs into a combined output, and
the spatial power combiner comprises a waveguide dimensioned such that coupling of the amplified outputs into the waveguide generates the combined output comprising a transverse electric, mode having an order higher than a $TE_{10}$ mode, or a transverse magnetic mode having an order higher than a $TM_{01}$ mode, or a transverse electromagnetic mode having an order higher than a fundamental mode.

* * * * *